(12) United States Patent
Gabrys et al.

(10) Patent No.: US 9,153,726 B1
(45) Date of Patent: Oct. 6, 2015

(54) INDUCTIVE OPTICAL SENSOR UTILIZING FRONTSIDE PROCESSING OF PHOTO SENSITIVE MATERIAL

(71) Applicant: Texas Instruments Incorporated, Dallas, TX (US)

(72) Inventors: Ann Gabrys, Santa Clara, CA (US); Peter Hopper, San Jose, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 14/249,967

(22) Filed: Apr. 10, 2014

(51) Int. Cl.
*H01L 31/02* (2006.01)
*H01L 31/0336* (2006.01)
*H01L 31/109* (2006.01)
*H01L 31/18* (2006.01)

(52) U.S. Cl.
CPC ........ *H01L 31/109* (2013.01); *H01L 31/02005* (2013.01); *H01L 31/1804* (2013.01); *H01L 31/184* (2013.01)

(58) Field of Classification Search
None
See application file for complete search history.

(56) References Cited

U.S. PATENT DOCUMENTS 6,885,040 B2 * 4/2005 Kim et al. ..................... 257/186
8,390,025 B2    3/2013 Gabrys et al.

* cited by examiner

*Primary Examiner* — Sonya D McCall Shepard
(74) *Attorney, Agent, or Firm* — Jacqueline J. Garner; Frank D. Cimino

(57) ABSTRACT

A photodetector detects the absence or presence of light by detecting a change in the inductance of a coil. The magnetic field generated when a current flows through the coil passes through an electron-hole generation region. Charged particles in the electron-hole generation region come under the influence of the magnetic field, and generate eddy currents whose magnitudes depend on whether light is absent or present. The eddy currents generate a magnetic field that opposes the magnetic field generated by current flowing through the coil.

20 Claims, 6 Drawing Sheets

INDUCTIVE OPTICAL SENSOR UTILIZING FRONTSIDE PROCESSING OF PHOTO SENSITIVE MATERIAL

FIELD OF THE INVENTION

The present invention relates to photodetectors and, more particularly, to an inductively-coupled photodetector and a method of forming an inductively-coupled photodetector.

BACKGROUND OF THE INVENTION

A photodetector is a device that detects the presence or absence of light. A photodiode is a type of photodetector that is commonly formed by combining a p-type material with an n-type material. When exposed to electromagnetic radiation, such as infrared (IR), visible, and ultraviolet (UV) light, a photodiode generates a number of electron-hole pairs at different depths within the device depending upon the depth at which the electromagnetic radiation was absorbed by the device.

Black and white photodiodes are photodiodes that can collect photons over all or substantially the entire visible spectrum, which includes many colors, and therefore generate electron-hole pairs over a large vertical range within the photodiode. On the other hand, wavelength-limited or color photodiodes are photodiodes that collect photons over a much narrower range of wavelengths, such as UV, blue, green, red, or IR, and therefore generate electron-hole pairs over a much smaller vertical range within the photodiode.

Wavelength-limited or color photodiodes are commonly formed as a filtered device by adding a filter to a black and white photodiode. For example, a red wavelength-limited photodiode can be implemented by placing a red filter over a black and white photodiode. The red filter, in turn, only allows red light to enter the photodiode. Thus, although a black and white photodiode is capable of capturing a wider range of the visible light spectrum, the color filter limits the photodiode to collecting only a single color.

Wavelength-limited or color photodiodes are also commonly formed as unfiltered devices by adjusting the depth of the pn junction within the diode. For example, UV light has an absorption depth of less than approximately 0.7 microns, while IR light has an absorption depth of more than approximately 1.2 microns. Thus, an IR photodiode can be formed by utilizing a small depletion region 114 that lies across substantially only the absorption depth of IR light to collect only IR light.

FIG. 1 shows a cross-sectional diagram that illustrates a prior-art IR photodiode 100. As shown in FIG. 1, IR photodiode 100 includes a p-type (boron) region 110, such as a substrate, an n-type region 112, such as an epitaxial layer or well, that overlies and contacts p-type region 110, and a depletion region 114 that is formed across the pn junction between p-type region 110 and n-type region 112.

Photodiode 100 can be formed as a filtered device, e.g., as a black and white device with a large depletion region 114 (that lies across the absorption depths of a number of wavelengths of light), and an IR filter that allows only IR light to enter photodiode 100. Photodiode 100 can alternately be formed as an unfiltered device, e.g., as a device with a small depletion region 114 (that lies substantially only across the absorption depth of IR light) that collects only IR light. Further, photodiode 100 includes an isolation region 116, such as oxide, that is formed on n-type region 112.

In operation, IR photodiode 100 is first reset by placing a reset voltage on n-type region 112 that reverse biases the pn junction. The reverse-biased voltage, which sets up an electric field across the junction, increases the width of depletion region 114 so that the IR portion of the electromagnetic spectrum can be absorbed in depletion region 114.

Once photodiode 100 is reset, photodiode 100 is then exposed to a source of electromagnetic radiation for an integration period. When photodiode 100 is struck by infrared radiation during the integration period, the radiation penetrates into the semiconductor material down to an absorption depth where the IR wavelengths of light are absorbed in depletion region 114.

The IR wavelengths of light absorbed in depletion region 114 generate a number of electron-hole pairs in depletion region 114. The electric field set up across the reverse-biased pn junction attracts the electrons that are formed in depletion region 114 (along with the electrons that are formed in p-type region 110 within a diffusion length of depletion region 114) to n-type region 112 where each additional electron reduces the magnitude of the reset voltage that was placed on n-type region 112.

Thus, at the end of the integration period, the total number of electrons collected by n-type region 112 has reduced the reset voltage to an integrated voltage. As a result, the total number of electrons collected by n-type region 112 during the integration period, which is a measure of the intensity of the received IR electromagnetic radiation, can be determined by subtracting the integrated voltage from the reset voltage. As a result, photodiode 100 can be utilized as a photodetector by indicating the absence of IR light when the difference between the reset voltage and the integrated voltage is small and lies within a range of values, and indicating the presence of IR light when the difference between the reset voltage and the integrated voltage is large and lies outside of the range of values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application, a photodetector is provided. The photodetector comprises: a semiconductor structure having: an indirect band gap material having a top surface; a non-conductive region touching a top surface of the indirect band gap material; a substrate region touching a top surface of the non-conductive region; a coil touching the top surface of the substrate region, and lying directly vertically over the indirect band gap material; a passivation region touching the top surface of the coil and the top surface of the substrate region; and a direct band gap material touching the top surface of the passivation region.

In accordance with another embodiment of the present application, a method of forming a photodetector is provided. The method of forming a photodetector comprising: providing an indirect band gap material having at top surface; depositing a non-conductive material on the top surface of the indirect band gap material; forming a substrate region over the non-conductive material; forming a coil formed over substrate region; forming a passivation layer on the coil touching the coil and the top of the substrate region; and depositing a direct band gap material on a top surface of the passivation layer.

DESCRIPTION OF THE VIEWS OF THE DRAWINGS

FIG. 2A is a plan view, while FIGS. 2B, 2C and 2D are a cross-sectional views taken along line A-A of FIG. 2A. FIG. 2B shows the photodetector with passivation over the inductor and FIG. 2C shows the photodetector without passivation over the inductor and FIG. 2D shows a photodetector on an insulative substrate.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
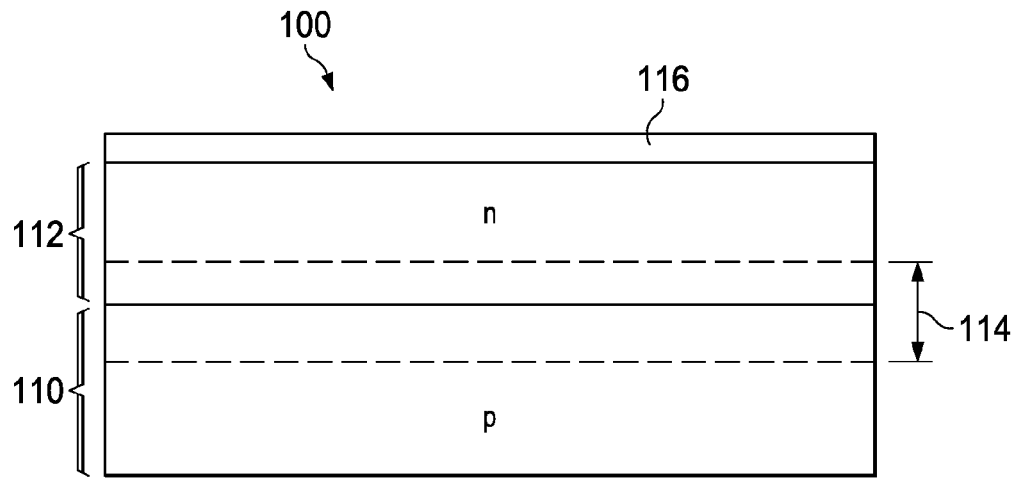
FIG. 1 is a cross-sectional diagram illustrating a prior-art IR photodiode 100.
Figure 2A:
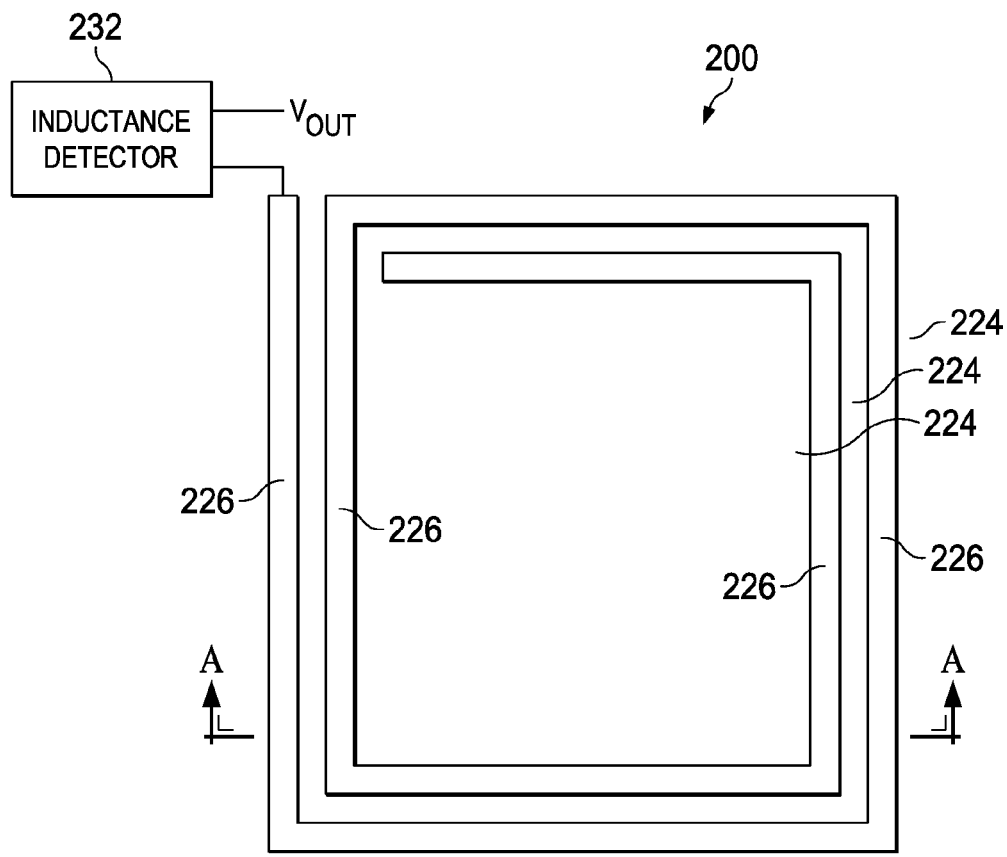
FIGS. 2A-2D are views illustrating an inductively-coupled photodetector 200 in accordance with the present invention.
Figure 2B:
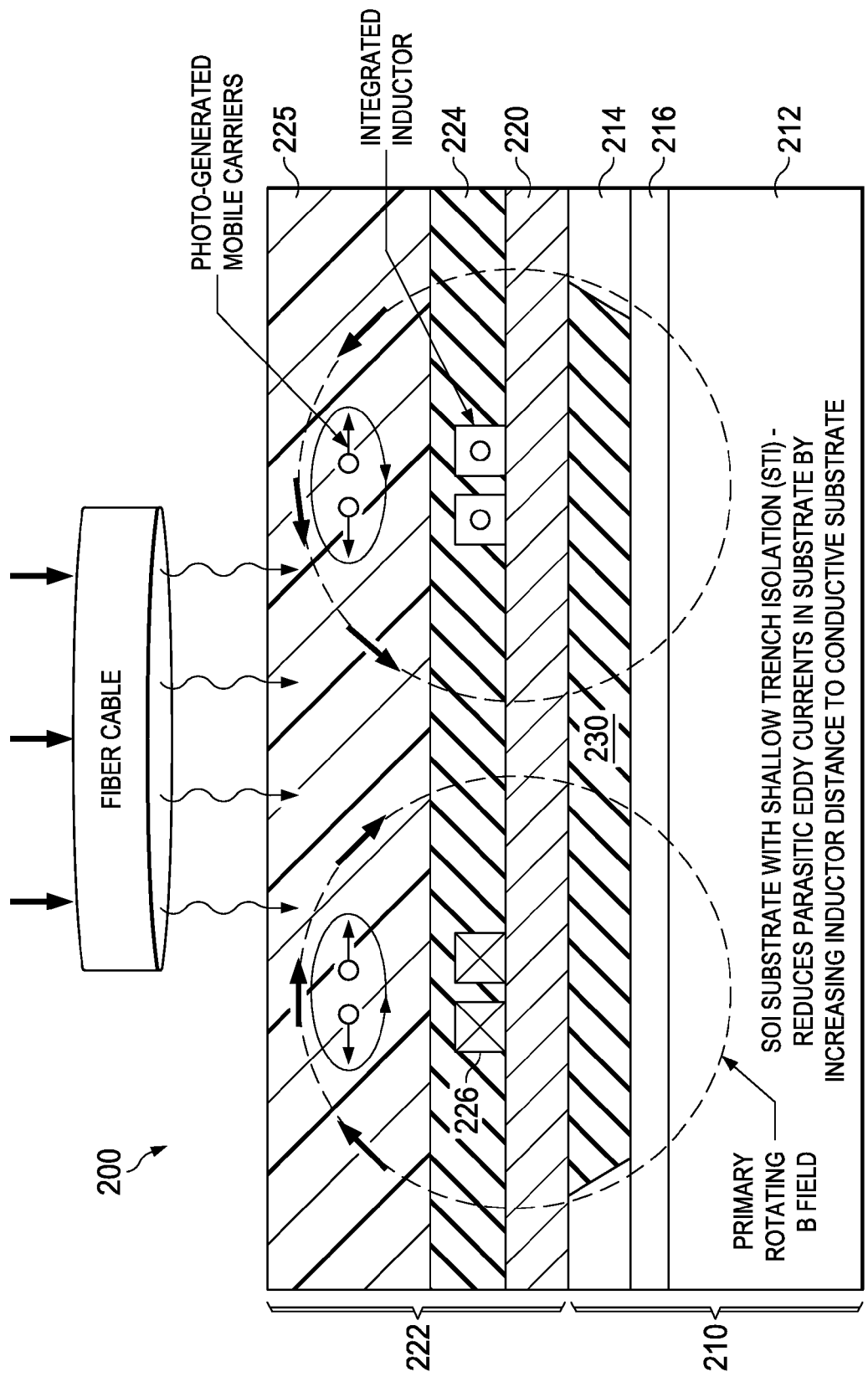

FIGS. 2A-2D shows views that illustrate an inductively-coupled photodetector 200 in accordance with the present invention. FIG. 2A shows a plan view, while FIG. 2B shows a cross-sectional view taken along line A-A of FIG. 2A, wherein FIG. 2B includes passivation covering the inductor and FIG. 2C does not include passivation covering the inductor and FIG. 2D has the inductor on top of an insulative substrate 240. As described in greater detail below, the present invention utilizes optically-enhanced eddy currents to vary the strength of a magnetic field, where variations in the strength of the magnetic field indicate the absence or presence of light.

As shown in FIG. 2B, photodetector 200 includes a semiconductor structure 210 that has a bulk semiconductor region 212, a substrate 214, and an insulation region 216 that lies between, touches, and electrically isolates bulk semiconductor region 212 from substrate 214. In the present example, both bulk semiconductor region 212 and substrate 214 are implemented with single-crystal silicon, which is an indirect band gap material, and have a conductivity type such as p-type. Thus, in the present example, semiconductor structure 210 is a silicon-on-insulator (SOI) structure.

In addition, photodetector 200 has a number of electrical devices that are formed in and on substrate 214. The electrical devices include, for example, transistors, resistors, capacitors, and diodes.

Photodetector 200 also has a shallow trench isolation region STI 230 that is formed completely through a portion of substrate 214 to touch the top surface of insulation region 216.

Further, photodetector 200 has a metal interconnect structure 222 that includes standard backend 220, which includes a number of layers of metal traces, a number of contacts, vias and an insulator layer covering the layers of metal traces, and a passivation region 224 that touches the insulator layer covering the metal traces, contacts, and vias. Passivation region 224 touches the top surface of standard backend 220.

In addition, the metal interconnect structure 222 includes a coil 226 that touches the standard backend 220 and is overlayed by the passivation region 224. Contacts extend through portions of the insulator layer covering the layers of metal traces to make electrical connections between device regions in and on substrate 214 and the first level of metal traces, while the vias extend through portions of passivation region 224 to make inter level connections between the layers of metal traces. Metal interconnect structure 222 electrically connects the devices 220 and coil 226 together to form an electrical circuit.

In the present example, coil 226 is formed as a planar spiral inductor in a metal layer of metal interconnect structure 222. The contacts to coil 226 extend through portions of passivation region 224 and the top insulator layer of the standard backend 220 to make electrical connections between device regions in and on substrate 214 and the first level of metal traces of the standard backend, while vias extend through portions of standard backend 220 to make inter level connections between the layers of metal traces. Coil 226 can alternately be formed in metal layers other than the first metal layer of metal interconnect structure 222, but is preferably formed close to the top surface of substrate 214.

In accordance with the present invention, FIG. 2B, photodetector 200 includes an electron-hole generation region 225 that is formed on the top side of semiconductor structure 210 to touch passivation region 224. As shown, no portion of electron-hole generation region 225 is in contact with the top surface of bulk semiconductor region 212. The electron-hole generation region 225 can be applied to the top of the wafer, covering all of the die on the wafer or can be applied to the top of individual die during assembly into packages.

Further, the bottom surface of electron-hole generation region 225 lies on the top surface of passivation region 224. In addition, the shallow trench isolation region STI lies directly vertically below electron-hole generation region 225, and directly vertically below coil 226. Thus, as shown, only a nonconductive region lies vertically between coil 226 and electron-hole generation region 225.

Electron-hole generation region 225 is implemented with a material that generates a larger number of electron-hole pairs in electron-hole generation region 225 than are generated in an equivalently-sized region of bulk semiconductor region 212 when subject to equivalent input light conditions. In addition, the electron-hole pairs in electron-hole generation region 225 have shorter recombination lifetimes than do electron-hole pairs in an equivalently-sized region of bulk semiconductor region 212.

In the present example, electron-hole generation region 225 is implemented with a direct band gap material, while bulk semiconductor region 212 is implemented with an indirect band gap material. As a result of using a direct band gap material, a larger number of electron-hole pairs are generated in electron-hole generation region 225 than are generated in an equivalently-sized region of indirect band gap material when subject to equivalent input light conditions. In addition, the electron-hole pairs in electron-hole generation region 225 have shorter recombination lifetimes than do electron-hole pairs in an equivalently-sized region of indirect band gap material.

For example, electron-hole generation region 225 can be implemented with a region of amorphous gallium arsenide (GaAs). GaAs, a direct band gap material, generates more electron-hole pairs than an equivalent region of single-crystal silicon, an indirect band gap material, in response to the same input IR light conditions. In addition, the recombination lifetimes of electron-hole pairs in GaAs are shorter than the recombination lifetimes of electron-hole pairs in single-crystal silicon.

In operation, a light source, such as a fiber optic cable, is directed at electron-hole generation region 225. In addition, when a DC current flows through coil 226, a magnetic field B is created around coil 226. In accordance with the present invention, as shown in FIGS. 2A-2B, the magnetic field B extends through substrate 214 and above passivation region 224 into electron-hole generation region 225.

When no light is received from the light source by electron-hole generation region 225, the strength of the magnetic field B is limited by the effects of eddy currents E. When free charged particles (e.g., electrons and holes) in electron-hole generation region 225 come under the influence of the magnetic field B, the free charged particles create eddy currents E which flow in a circular pattern that is perpendicular to the magnetic field B. The eddy currents E, in turn, create corresponding magnetic fields that oppose, and thereby reduce the strength of, the magnetic field B.

However, when light is received from the light source by electron-hole generation region 225, the strength of the magnetic field B is substantially reduced by the effects of the eddy currents E. The effects of the eddy currents E are significantly worse when light is present than when light is not present. This is because when light is absorbed by electron-hole generation region 225, a large number of electron-hole pairs are generated in electron-hole generation region 225.

The photogenerated electron-hole pairs in electron-hole generation region 225 substantially increase the number of charged particles that are available to participate in the eddy currents. Thus, the increased number of charged particles substantially increases the magnitudes of the eddy currents E.

When the magnitudes of the eddy currents E are substantially increased, the strength of the magnetic field that is created by the eddy currents E is also substantially increased. Since the magnetic field generated by the eddy currents E opposes the magnetic field B, the increased opposing magnetic field from the increased magnitudes of the eddy currents substantially reduces the strength of the magnetic field B.

Thus, the magnetic field B generated by a current flowing through coil 226 has a first strength when electron-hole generation region 225 is exposed to a wavelength of light, and a second strength when electron-hole generation region 225 is exposed to no light, where the second strength is different from the first strength.

The inductance L of a coil is defined by: $L=NI\mu/B$, where N is the number of turns of the coil, $1\mu$ is the magnitude of the current flowing through the coil, $1\mu$ is the permeability of the core material (the material the magnetic field passes through), and B is the magnetic field. Thus, the inductance L of a coil is proportional to the magnitude of the magnetic field B.

As a result, the change in the strengths of the magnetic fields due to the absence or presence of light can be detected by a change in the inductance. Therefore, the inductance generated by a current flowing through coil 226 has a first value when electron-hole generation region 225 is exposed to a wavelength of light, and a second value when electron-hole generation region 225 is exposed to no light, where the second value is different from the first value.

A change in inductance, in turn, can be detected by an inductance detector, i.e., a circuit which outputs a value that varies in response to variations in the inductance. As further shown in FIG. 2A coil 226 is electrically connected to an inductance detector 232 to measure changes in inductance. Inductance detector 232 can be implemented in a number of different ways to detect changes in inductance. For example, an inductance detector can be implemented with an AC signal source and a conventional band-pass filter.

A silicon on insulator (SOI) substrate with shallow trench isolation (STI) reduces parasitic eddy currents in the substrate by increasing inductor distance to conductive substrate.

Figure 2C:
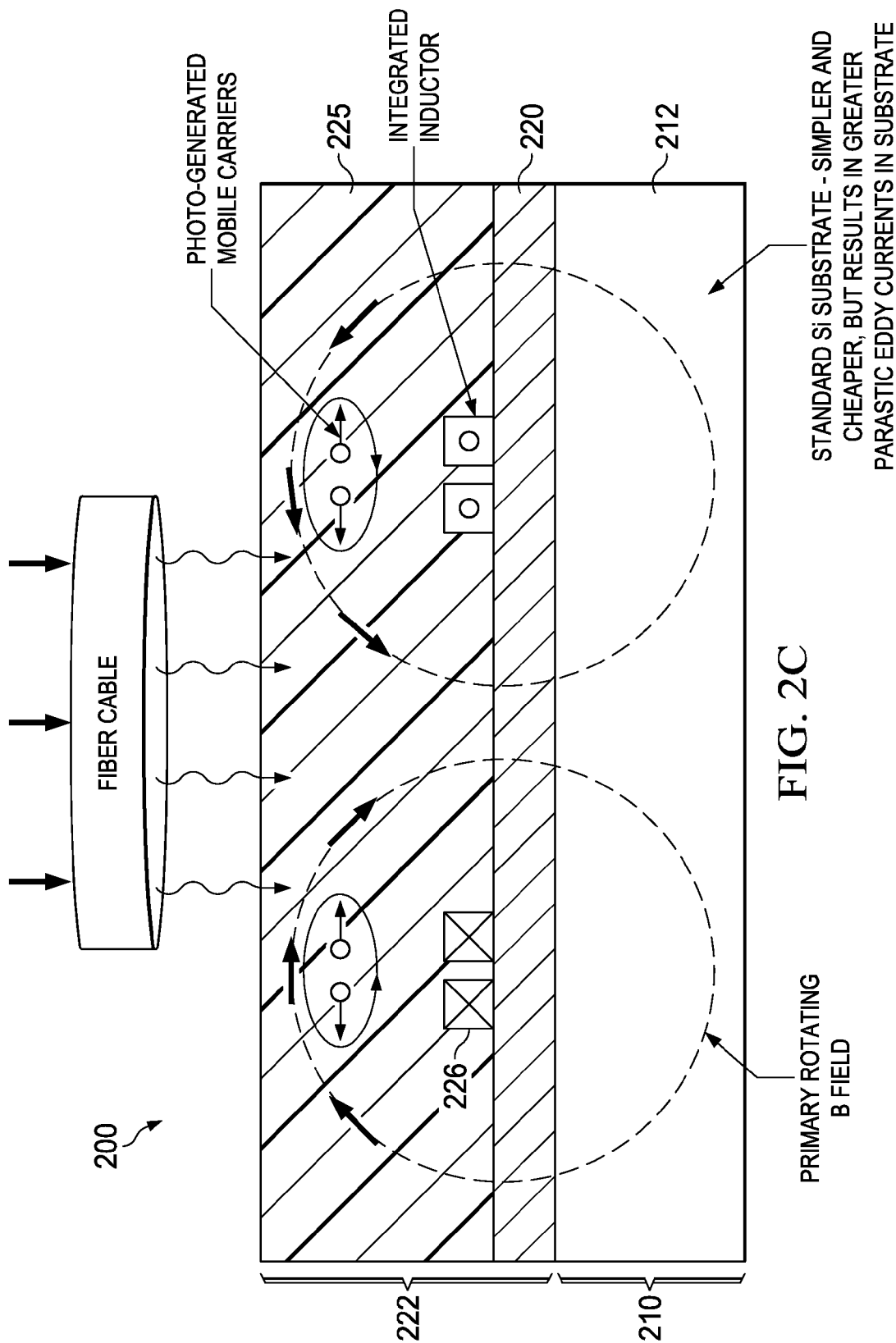

In another embodiment of this invention, FIG. 2C, photodetector 200 includes an electron-hole generation region 225 that is formed on the top side of semiconductor structure 210 to touch a standard backend 220. As shown, no portion of electron-hole generation region 225 is in contact with the top surface of bulk semiconductor region 212. The electron-hole generation region 225 can be applied to the top of the wafer, covering all of the die on the wafer, or can be applied to the top of individual die during assembly into packages.

Further, the bottom surface of electron-hole generation region 225 lies on the top surface of the standard backend 220.

Electron-hole generation region 225 is implemented with a material that generates a larger number of electron-hole pairs in electron-hole generation region 225 than are generated in an equivalently-sized region of bulk semiconductor region 212 when subject to equivalent input light conditions. In addition, the electron-hole pairs in electron-hole generation region 225 have shorter recombination lifetimes than do electron-hole pairs in an equivalently-sized region of bulk semiconductor region 212.

In the present example, electron-hole generation region 225 is implemented with a direct band gap material, while bulk semiconductor region 212 is implemented with an indirect band gap material. As a result of using a direct band gap material, a larger number of electron-hole pairs are generated in electron-hole generation region 225 than are generated in an equivalently-sized region of indirect band gap material when subject to equivalent input light conditions. In addition, the electron-hole pairs in electron-hole generation region 225 have shorter recombination lifetimes than do electron-hole pairs in an equivalently-sized region of indirect band gap material.

For example, electron-hole generation region 225 can be implemented with a region of amorphous gallium arsenide (GaAs). GaAs, a direct band gap material, generates more electron-hole pairs that an equivalent region of single-crystal silicon, an indirect band gap material, in response to the same input IR light conditions. In addition, the recombination lifetimes of electron-hole pairs in GaAs are shorter than the recombination lifetimes of electron-hole pairs in single-crystal silicon.

Figure 2D:
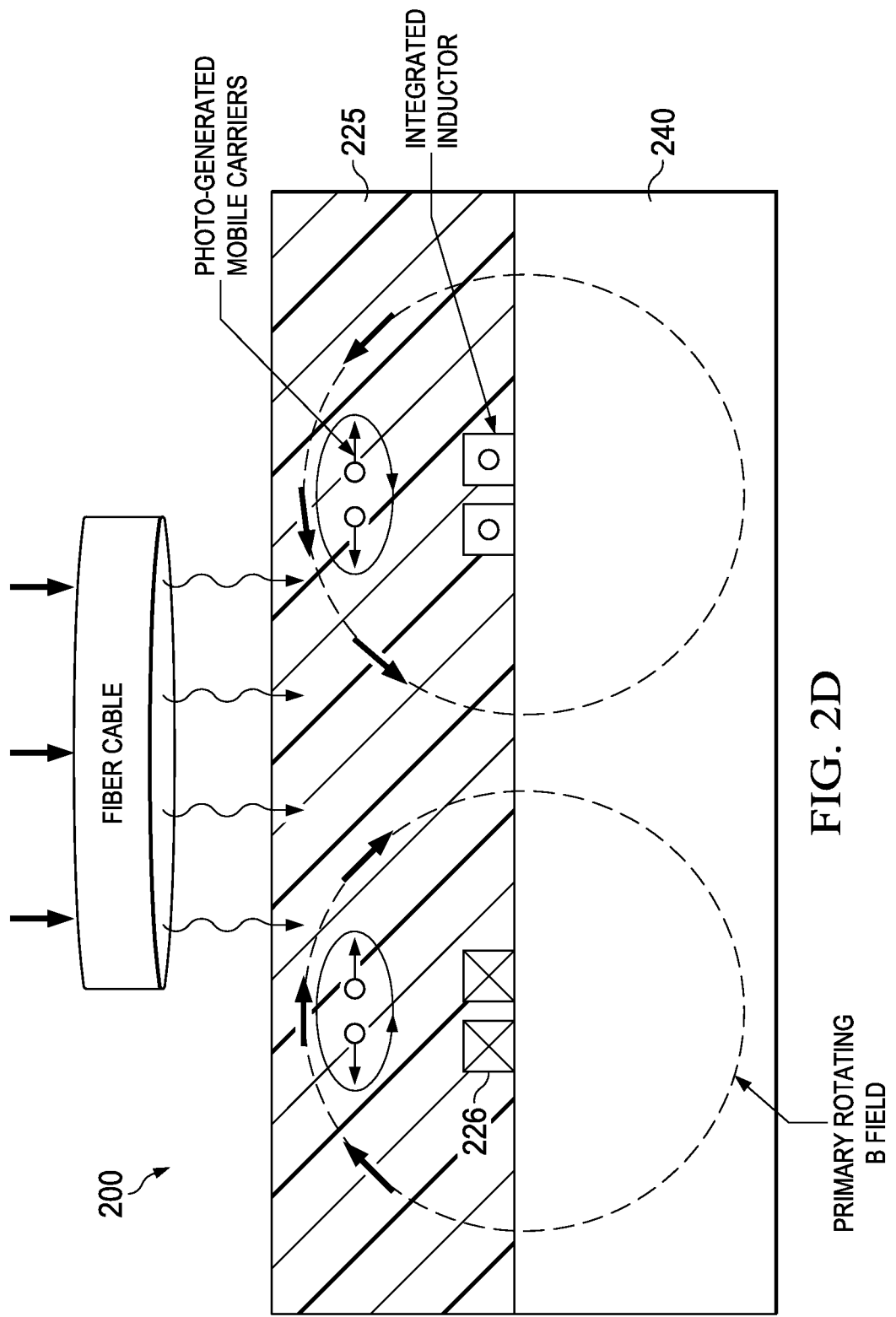

In operation, a light source, such as a fiber optic cable, is directed at electron-hole generation region 225. In addition, when a DC current flows through coil 226, a magnetic field B is created around coil 226. In accordance with the present invention, as shown in FIG. 2D, the magnetic field B extends through substrate 212 and above the standard backend 220 into electron-hole generation region 225.

When no light is received from the light source by electron-hole generation region 225, the strength of the magnetic field B is limited by the effects of eddy currents E. When free charged particles (e.g., electrons and holes) in electron-hole generation region 225 come under the influence of the magnetic field B, the free charged particles create eddy currents E which flow in a circular pattern that is perpendicular to the magnetic field B. The eddy currents E, in turn, create corresponding magnetic fields that oppose, and thereby reduce the strength of, the magnetic field B.

However, when light is received from the light source by electron-hole generation region 225, the strength of the magnetic field B is substantially reduced by the effects of the eddy currents E. The effects of the eddy currents E are significantly worse when light is present than when light is not present. This is because when light is absorbed by electron-hole generation region 225, a large number of electron-hole pairs are generated in electron-hole generation region 225.

The photogenerated electron-hole pairs in electron-hole generation region 225 substantially increase the number of charged particles that are available to participate in the eddy currents. Thus, the increased number of charged particles substantially increases the magnitudes of the eddy currents E.

When the magnitudes of the eddy currents E are substantially increased, the strength of the magnetic field that is created by the eddy currents E is also substantially increased. Since the magnetic field generated by the eddy currents E opposes the magnetic field B, the increased opposing magnetic field from the increased magnitudes of the eddy currents substantially reduces the strength of the magnetic field B.

Thus, the magnetic field B generated by a current flowing through coil 226 has a first strength when electron-hole generation region 225 is exposed to a wavelength of light, and a second strength when electron-hole generation region 225 is exposed to no light, where the second strength is different from the first strength.

The inductance L of a coil is defined by: $L = NI\mu/B$, where N is the number of turns of the coil, $1\mu$ is the magnitude of the current flowing through the coil, $1\mu$ is the permeability of the core material (the material the magnetic field passes through), and B is the magnetic field. Thus, the inductance L of a coil is proportional to the magnitude of the magnetic field B.

As a result, the change in the strengths of the magnetic fields due to the absence or presence of light can be detected by a change in the inductance. Therefore, the inductance generated by a current flowing through coil 226 has a first value when electron-hole generation region 225 is exposed to a wavelength of light, and a second value when electron-hole generation region 225 is exposed to no light, where the second value is different from the first value.

A change in inductance, in turn, can be detected by an inductance detector, i.e., a circuit which outputs a value that varies in response to variations in the inductance. As further shown in FIGS. 2A-2C coil 226 is electrically connected to an inductance detector 232 to measure changes in inductance. Inductance detector 232 can be implemented in a number of different ways to detect changes in inductance. For example, an inductance detector can be implemented with an AC signal source and a conventional band-pass filter.

A standard silicon substrate as shown in FIG. 2C is simpler and cheaper than the structure shown in FIG. 2B, but results in greater parasitic eddy currents in the substrate 212.

In a third embodiment of this invention FIG. 2D, photodetector 200 includes an electron-hole generation region 225 that is formed on the top side of an insulating substrate 240.

As in FIGS. 2B-2D, electron-hole generation region 225 is implemented with a material that generates a large number of electron-hole pairs in electron-hole generation region 225 where none are generated in an equivalently-sized region of insulating substrate. In addition, the electron-hole pairs in electron-hole generation region 225 have short recombination lifetimes.

For example, electron-hole generation region 225 can be implemented with a region of amorphous gallium arsenide (GaAs). GaAs. In addition, the recombination lifetimes of electron-hole pairs in GaAs are shorter than the recombination lifetimes of electron-hole pairs in single-crystal silicon.

In operation, a light source, such as a fiber optic cable, is directed at electron-hole generation region 225. In addition, when a DC current flows through coil 226, a magnetic field B is created around coil 226. In accordance with the present invention, the magnetic field B extends through the insulating substrate 240.

When no light is received from the light source by electron-hole generation region 225, the strength of the magnetic field B is limited by the effects of eddy currents E. When free charged particles (e.g., electrons and holes) in electron-hole generation region 225 come under the influence of the magnetic field B, the free charged particles create eddy currents E which flow in a circular pattern that is perpendicular to the magnetic field B. The eddy currents E, in turn, create corresponding magnetic fields that oppose, and thereby reduce the strength of, the magnetic field B.

However, when light is received from the light source by electron-hole generation region 225, the strength of the magnetic field B is substantially reduced by the effects of the eddy currents E. The effects of the eddy currents E are significantly worse when light is present than when light is not present. This is because when light is absorbed by electron-hole generation region 225, a large number of electron-hole pairs are generated in electron-hole generation region 225.

The photogenerated electron-hole pairs in electron-hole generation region 225 substantially increase the number of charged particles that are available to participate in the eddy currents. Thus, the increased number of charged particles substantially increases the magnitudes of the eddy currents E.

When the magnitudes of the eddy currents E are substantially increased, the strength of the magnetic field that is created by the eddy currents E is also substantially increased. Since the magnetic field generated by the eddy currents E opposes the magnetic field B, the increased opposing magnetic field from the increased magnitudes of the eddy currents substantially reduces the strength of the magnetic field B.

Thus, the magnetic field B generated by a current flowing through coil 226 has a first strength when electron-hole generation region 225 is exposed to a wavelength of light, and a second strength when electron-hole generation region 225 is exposed to no light, where the second strength is different from the first strength.

The inductance L of a coil is defined by: $L = NI\mu/B$, where N is the number of turns of the coil, $1\mu$ is the magnitude of the current flowing through the coil, 1μ is the permeability of the core material (the material the magnetic field passes through), and B is the magnetic field. Thus, the inductance L of a coil is proportional to the magnitude of the magnetic field B.

As a result, the change in the strengths of the magnetic fields due to the absence or presence of light can be detected by a change in the inductance. Therefore, the inductance generated by a current flowing through coil 226 has a first value when electron-hole generation region 225 is exposed to a wavelength of light, and a second value when electron-hole generation region 225 is exposed to no light, where the second value is different from the first value.

A change in inductance, in turn, can be detected by an inductance detector, i.e., a circuit which outputs a value that varies in response to variations in the inductance. As further shown in FIG. 2A coil 226 is electrically connected to an inductance detector 232 to measure changes in inductance. Inductance detector 232 can be implemented in a number of different ways to detect changes in inductance. For example, an inductance detector can be implemented with an AC signal source and a conventional band-pass filter.

An inductive optical sensor built on an insulator substrate 240 is simpler and cheaper than the structures shown in FIGS. 2B and 2C and can be used as a discrete inductive sensor which can be applied to many different hybrid circuit applications.

Figure 3A:
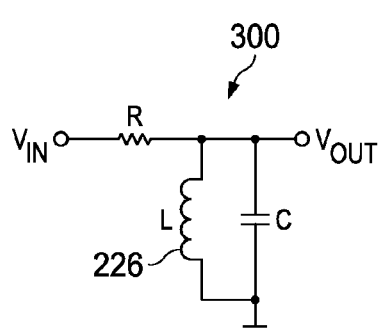
FIG. 3A is a circuit diagram illustrating an example of a band pass filter 300 in accordance with the present invention.
Figure 3B:
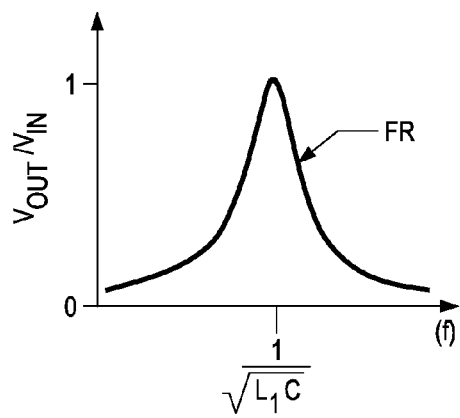
FIGS. 3B-3C are graphs illustrating the operation of band pass filter 300 in accordance with the present invention.
Figure 3C:
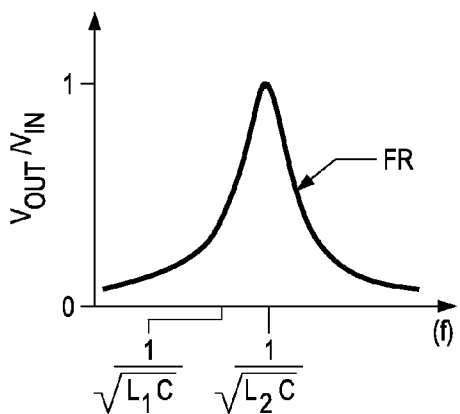

FIG. 3A shows a circuit diagram that illustrates an example of a band pass filter 300 in accordance with the present invention. FIGS. 3B-3C show graphs that illustrate the operation of band pass filter 300 in accordance with the present invention. As shown in FIG. 3A, band pass filter 300 includes an inductor L, which is implemented with inductor 226, and a capacitor C which are connected in parallel between $V_{OUT}$ and ground, and a resistor R that is connected between the AC input signal $V_{IN}$ and $V_{OUT}$.

FIG. 3B shows the frequency response FR of band pass filter 300 when no light is present, which illustrates that the center frequency of band pass filter 300 is equal to $1/\sqrt{L1C}$. Thus, when no light is present and the AC input signal $V_{IN}$ has a frequency of $1/\sqrt{L1C}$, band pass filter 300 passes 5 substantially all of the AC input signal $V_{IN}$.

FIG. 3C shows the frequency response FR of band pass filter 300 when light is present, which illustrates that the center frequency of band pass filter 300 has shifted to $1/\sqrt{L2C}$ due to the change in inductance. Thus, when light is present and the AC input signal $V_{IN}$ has a frequency of $1/\sqrt{L1C}$, band pass filter 300 substantially attenuates the AC input signal. Thus, the change in amplitude of the AC signal indicates whether light is absent or present.

Figure 4A:
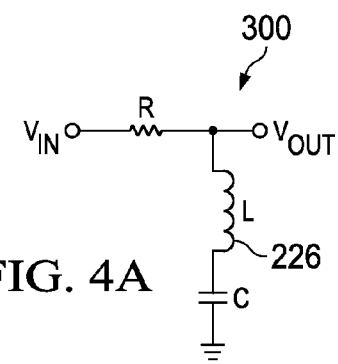
FIG. 4A is a circuit diagram illustrating an example of a notch filter 400 in accordance with the present invention.
Figure 4B:
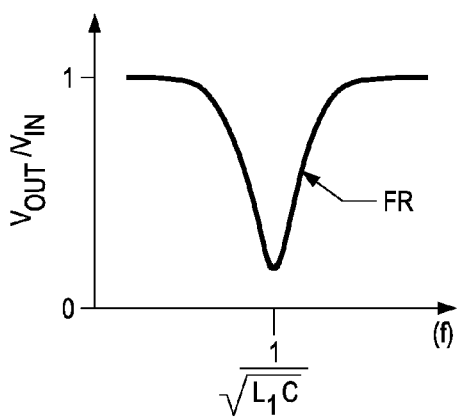
FIGS. 4B-4C are graphs illustrating the operation of notch filter 400 in accordance with the present invention.
Figure 4C:
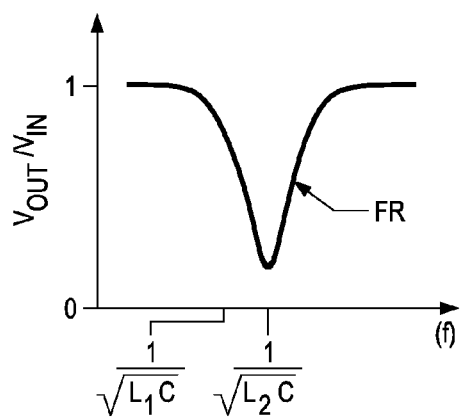

An inductance detector can also be implemented with an AC signal source and a conventional notch filter. FIG. 4A shows a circuit diagram that illustrates an example of a notch filter 400 in accordance with the present invention. FIGS. 4B-4C show graphs that illustrate the operation of notch filter 400 in accordance with the present invention. As shown in FIG. 4A, notch filter 400 includes an inductor L, which is implemented with inductor 226, and a capacitor C connected in series between $V_{OUT}$ and ground, and a resistor R that is connected between the AC input signal $V_{IN}$ and $V_{OUT}$.

FIG. 4B shows the frequency response FR of notch filter 400 when no light is present, which illustrates that the center frequency of notch filter 400 is also equal to $1/\sqrt{L1C}$. Thus, when no light is present and the AC input signal $V_{IN}$ has a frequency of $1/\sqrt{L_1 C}$, notch filter 400 attenuates substantially all of the AC input signal $V_{IN}$.

FIG. 4C shows the frequency response FR of notch filter 400 when light is present, which illustrates that the center frequency of notch filter 400 has shifted to $1/\sqrt{L_2C}$ due to the change in inductance. Thus, when light is present and the AC input signal $V_{IN}$ has a frequency of $1/\sqrt{L_1C}$, notch filter 400 passes substantially more of the AC input signal $V_{IN}$. Thus, the change in amplitude of the AC signal again indicates whether light is absent or present.

Figure 5:
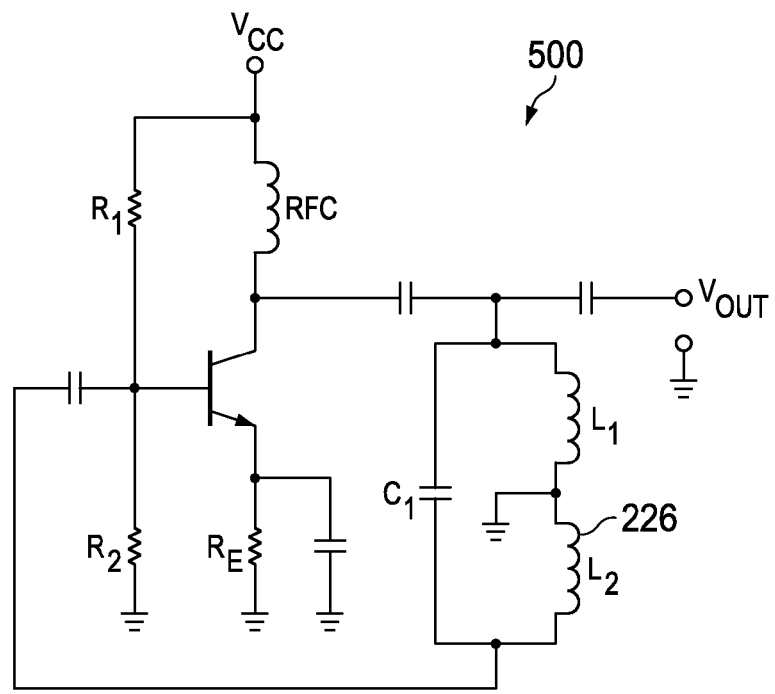
FIG. 5 is a circuit diagram illustrating an example of a Hartley oscillator 500 in accordance with the present invention.

An inductance detector can further be implemented with an oscillator, such as a Hartley oscillator or a Colpitts oscillator, which indicates a change in inductance by a change in frequency. FIG. 5 shows a circuit diagram that illustrates an example of a Hartley oscillator 500 in accordance with the present invention, while FIG. 6 shows a circuit diagram that illustrates an example of a Colpitts oscillator 600 in accordance with the present invention.

As shown in FIG. 5, Hartley oscillator 500 includes an inductor $L_1$ and an inductor $L_2$, one of which is implemented with inductor 226. The total inductance $L_T$ of oscillator 500 is equal to $L_T = L_1 + L_2$. The frequency output by oscillator 500 is equal to $f = 1/2\pi\sqrt{L_T C_1}$. Thus, since the frequency is a function of the inductance, the change in frequency of the AC signal indicates whether light is absent or present.

Figure 6:
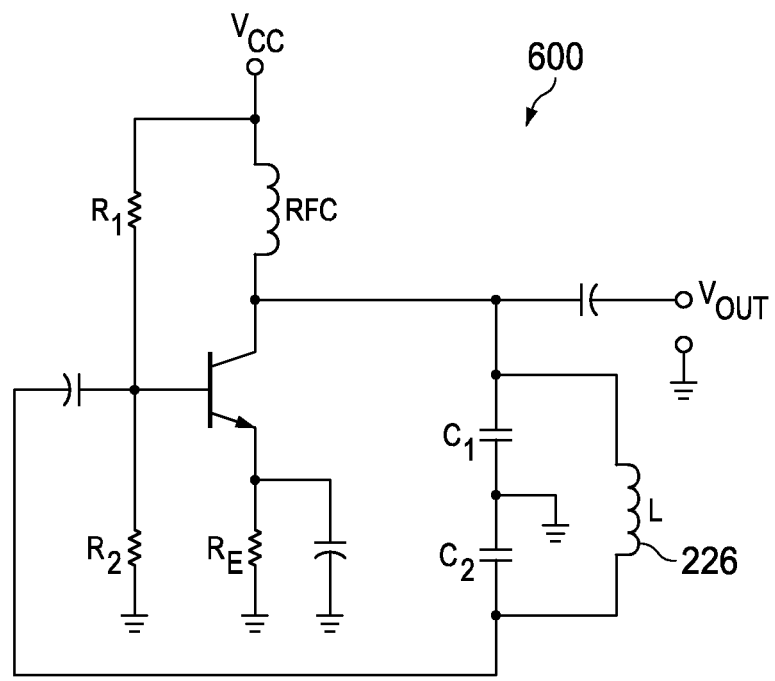
FIG. 6 is a circuit diagram illustrating an example of a Colpitts oscillator 600 in accordance with the present invention.

As shown in FIG. 6, Colpitts oscillator 600 includes an inductor L, which is implemented with inductor 226, a capacitor $C_1$, and a capacitor $C_2$. The total capacitance $C_T$ of oscillator 600 is equal to $C_T = C_1 C_2/C_1 + C_2$. The frequency output by oscillator 600 is equal to $f = 1/2\pi\sqrt{C_T}$. Thus, since the frequency is a function of the inductance, the change in frequency of the AC signal indicates whether light is absent or present.

FIG. 2B shows a cross-sectional view that illustrates a method of forming an inductively-coupled photodetector in accordance with the present invention. As shown in FIG. 2B, the method utilizes a conventionally-formed semiconductor wafer including a photosensitive layer 225 applied to the top of the conventionally-formed semiconductor wafer, wherein the electron-hole generation region can be applied to the top of the wafer, covering all the die on the wafer or can be applied to the top of individual die during assembly into packages. Structure 200 includes a semiconductor structure 210, that has a bulk semiconductor region 212, a substrate 214, and an insulation region 216 that lies between, touches, and electrically isolates bulk semiconductor region 212 from substrate 214. In the present example, both bulk semiconductor region 212 and substrate 214 are implemented with single-crystal silicon, which is an indirect band gap material, and has a conductivity type such as p-type.

In addition, structure has a number of electrical devices that are formed in and on substrate 214. The electrical devices include, for example, transistors, resistors, capacitors, and diodes. Structure 200 also has a shallow trench isolation region STI that that is formed to extend completely through a portion of substrate 214 to touch the top surface of insulation region 216.

Further, structure 200 has a metal interconnect structure 222 that includes a number of layers of metal traces, a number of contacts and vias, and a non-conductive region 224 that touches the metal traces, contacts, and vias. Non-conductive region 224 touches the top surface of substrate 214.

In addition, one of the metal layers includes a coil 226 which touches the non-conductive region 224. Contacts extend through portions of non-conductive region 224 to make electrical connections between device regions in and on substrate 214 and the first level of metal traces, while the vias extend through portions of non-conductive region 224 to make interlevel connections between the layers of metal traces. Metal interconnect structure 222 electrically couple the electrical devices in the substrate 214 and coil 226 together to form an electrical circuit.

In the present example, coil 226 that is formed as a planar spiral inductor in the first metal layer of metal interconnect structure 222. Coil 226 can alternately be formed in metal layers other than the first metal layer of metal interconnect structure 222, but is preferably formed close to the top surface of substrate 214.

Following this, as shown in FIG. 2B, a photosensitive layer 225, which can be deposited in a low temperature setting that is compatible with back end processing, is formed on the passivation layer 224. Photosensitive layer 225 can be implemented with an amorphous gallium arsenide (GaAs) layer.

FIG. 2C shows another embodiment of a method of forming an inductively-coupled photodetector in accordance with the present invention. As shown in FIG. 2C, the method utilizes a conventionally-formed semiconductor wafer including a photosensitive layer 225 applied to the top of the conventionally-formed semiconductor wafer, wherein the electron-hole generation region can be applied to the top of the wafer, covering all the die on the wafer or can be applied to the top of individual die during assembly into packages. Structure 200 includes a semiconductor structure 210 that has a bulk semiconductor region 212. In the present example, the bulk semiconductor region 212 is implemented with single-crystal silicon, which is an indirect band gap material, and has a conductivity type such as p-type.

In addition, structure 210 has a number of electrical devices that are formed in and on substrate 212. The electrical devices include, for example, transistors, resistors, capacitors, and diodes.

Further, structure 200 has a metal interconnect structure 222 that includes a number of layers of metal traces, a number of contacts and vias.

In addition, one of the metal layers includes a coil 226 which touches the Standard backend 220. Contacts extend through portions of non-conductive regions of 220 to make electrical connections between device regions in and on substrate 212 and the first level of metal traces, while the vias extend through portions of standard backend 220 to make interlevel connections between the layers of metal traces. Metal interconnect structure 222 electrically couples the electrical devices in the substrate 212 and coil 226 together to form an electrical circuit.

In the present example, coil 226 that is formed as a planar spiral inductor in the first metal layer of metal interconnect structure 222. Coil 226 can alternately be formed in metal layers other than the first metal layer of metal interconnect structure 222, but is preferably formed close to the top surface of substrate 212.

Following this, as shown in FIG. 2C, a photosensitive layer 225, which can be deposited in a low temperature setting that is compatible with back end processing, is formed on the standard backend 220. Photosensitive layer 225 can be implemented with an amorphous gallium arsenide (GaAs) layer.

FIG. 2D shows a third embodiment of a method of forming an inductively-coupled photodetector in accordance with the present invention. As shown in FIG. 2D, the method utilizes a insulative wafer 240 including a photosensitive layer 225 applied to the top of the insulative wafer 240, wherein the electron-hole generation region can be applied to the top of the wafer, covering all the die on the wafer or can be applied to the top of individual die during assembly into packages.

Photosensitive layer 225 includes a coil 226 which touches the Standard top of the insulative wafer 240.

In the present example, coil 226 that is formed as a planar spiral inductor in a metal layer on the insulating wafer 240.

Following this, as shown in FIG. 2D, a photosensitive layer 225, is formed on the insulative wafer 240. Photosensitive layer 225 can be implemented with an amorphous gallium arsenide (GaAs) layer.

Thus, inductively-coupled photodetectors and methods of forming the inductively-coupled photodetectors have been described. One of the advantages of the various embodiments of photodetectors 200 is that since the figure of merit involved in sensing incident photons does not depend on carrier collection within the photosensitive material (electron-hole generation region 225), and thus no required contact with the material or carrier flow, the present invention has higher response frequencies, higher efficiency, and more flexible implementation options (i.e., the material used to form electron-hole generation region 225 can be selected based on the light frequency of interest).

Another advantage of the present invention is that in the absence of light, electron-hole generation region 225 must rapidly return to its initial equilibrium state to enable detection of subsequent light signals. The present invention provides a low (~1 psec) recombination lifetime when using GaAs, and allows the use of amorphous materials with simpler processing.

Thus, electron-hole generation region 225 from any material, such as an amorphous material, which has low temperature deposition requirements, the ability to generate more electron-hole pairs than the material of bulk semiconductor region 212 when exposed to a light frequency of interest, and a recombination lifetime that is sufficient to accommodate the frequency of the light signals.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A photodetector comprising:
a semiconductor structure having:
an indirect band gap material having a top surface;
a non-conductive region touching a top surface of the indirect band gap material;
a substrate region touching a top surface of the non-conductive region, wherein the substrate region includes a non conductive region lying directly under a coil;
the coil touching the top surface of the substrate region, and lying directly vertically over the indirect band gap material;
a standard backend that touches and overlays the top surface of the substrate region, wherein the standard backend includes an insulator layer covering the layers of metal traces of the standard backend;
a passivation region touching the top surface of the coil and the top surface of the standard backend; and
a direct band gap material touching the top surface of the passivation region.

2. The photodetector of claim 1, wherein all of the direct band gap material lies above the top surface of the indirect band gap material.

3. The photodetector of claim 1, wherein the direct band gap material includes gallium arsenide, and the indirect band gap material includes single-crystal silicon.

4. The photodetector of claim 1, wherein, the non-conductive region electrically isolates the indirect band gap material from the substrate region.

5. The photodetector of claim 1, and further comprising a shallow trench isolation region that extends completely through the substrate region to touch the insulation region.

6. The photodetector of claim 5, wherein the shallow trench isolation region lies directly vertically above the indirect band gap material, and directly vertically below the coil.

7. The photodetector of claim 1, wherein the direct band gap material includes gallium arsenide, and the indirect band gap material includes single-crystal silicon.

8. The photodetector of claim 1, wherein only a passivation region lies vertically between the direct band gap material and the coil.

9. The photodetector of claim 1, further comprising a number of devices that are formed in and on the substrate region.

10. The photodetector of claim 9 wherein the number of devices are electrically connected together by way of the metal interconnect structure to form an inductance detector that measures changes in an inductance of the coil.

11. The photodetector of claim 1, wherein a magnetic field generated by a current flowing through the coil has a first strength when the direct band gap material is exposed to a wavelength of light, and a second strength when the direct band gap material is exposed to no light, the second strength being different from the first strength.

12. The photodetector of claim 1, wherein an inductance generated by a current flowing through the coil has a first value when the direct band gap material is exposed to a wavelength of light, and a second value when the direct band gap material is exposed to no light, the second value being different from the first value.

13. The photodetector of claim 1, wherein a larger number of electron-hole pairs are generated in the direct band gap material than are generated in an equivalently-sized region of the indirect band material when subject to equivalent input light conditions.

14. The photodetector of claim 1, wherein electron-hole pairs in the direct band gap material have shorter recombination lifetimes than do electron-hole pairs in an equivalently sized region of the indirect band gap material.

15. A method of forming a photodetector comprising:
providing an indirect band gap material having at top surface;
depositing a non-conductive material on the top surface of the indirect band gap material;
forming a substrate region over the non-conductive material;
forming a coil formed over substrate region;
forming a passivation layer on the coil touching the coil and the top of the substrate region; and
depositing a direct band gap material on a top surface of the passivation layer.

16. The method of claim 15 wherein the direct band gap material includes gallium arsenide, and the indirect band gap material includes single-crystal silicon.

17. The photodetector of claim 1, wherein the semiconductor structure comprises:
a conventionally-formed semiconductor wafer, having a top surface;
the standard backend that touches and overlays the top surface of the conventionally-formed semiconductor wafer, wherein the standard backend includes the insulator layer covering the layers of metal traces of the standard backend;
a coil that touches the top of the standard backend; and
direct band gap material touching the top surface of the coil and the standard backend.

18. The photodetector of claim 1, wherein the semiconductor structure comprises:
an insulating substrate;
the coil that touches the top of the insulating substrate; and
the direct band gap material touching the top surface of the coil and the insulating substrate.

19. The method of claim 15, wherein forming a photodetector comprises:
conventionally-forming a semiconductor wafer, having a top surface;
overlaying the standard backend that touches the top surface of the conventionally-formed semiconductor wafer, wherein the standard backend includes the insulator layer covering the layers of metal traces of the standard backend;
forming the coil that touches the top of the standard backend; and
depositing the direct band gap material that touches the top surface of the coil and the standard backend.

20. The method of claim 15, wherein forming a photodetector comprises:
providing an insulating substrate;
forming the coil that touches the top of the insulating substrate; and
depositing the direct band gap material that touches the top surface of the coil and the insulating substrate.

* * * * *